United States Patent

[11] 3,594,782

[72] Inventor Robert L. Carbrey
Colts Neck, N.J.
[21] Appl. No. 808,769
[22] Filed Mar. 20, 1969
[45] Patented July 20, 1971
[73] Assignee Bell Telephone Laboratories, Incorporated
Murray Hill, Berkeley Heights, N.J.

[54] DIGITAL-TO-ANALOG CONVERSION CIRCUITS
10 Claims, 3 Drawing Figs.

[52] U.S. Cl. ........ 340/347 DA
[51] Int. Cl. ........ H03k 13/04
[50] Field of Search ........ 340/347

[56] References Cited

UNITED STATES PATENTS

| | | | |
|---|---|---|---|
| 3,441,913 | 4/1969 | Pastoriza | 340/347 |
| 3,298,018 | 1/1967 | Janssen | 340/347 |
| 3,307,173 | 2/1967 | Popodi | 340/347 |

*Primary Examiner*—Daryl W. Cook
*Assistant Examiner*—Jeremiah Glassman
*Attorneys*—R. J. Guenther and Kenneth B. Hamlin

ABSTRACT: Digital-to-analog conversion circuits are described in which a plurality of capacitors are charged by digitally weighted voltages. The capacitors are then placed in series to provide an analog output voltage. A system is also shown in which a plurality of these digital-to-analog conversion circuits are operated from a common voltage source.

INVENTOR
R.L. CARBREY
BY [signature]
ATTORNEY

DIGITAL-TO-ANALOG CONVERSION CIRCUITS

FIELD OF THE INVENTION

This invention relates to digital-to-analog conversion circuits and particularly to digital-to-analog conversion circuits which contain no precision components but share digitally weighted voltage sources in common.

BACKGROUND OF THE INVENTION

A digital-to-analog conversion circuit receives a digital signal coded to represent an analog value as an input and provides an output signal having an amplitude proportional to the value represented by the digitally coded signal. In most digital-to-analog conversion circuits, the digitally coded input signal is employed to open or close switches placing selected digitally weighted electronic components in a circuit configuration. A precision voltage or current is then applied to the circuit configuration to provide a composite analog output signal, each of the selected components contributing a digitally weighted factor to the output signal.

The cost of most digital-to-analog conversion systems, is determined by the precision required in the digitally weighted components and the precision voltage or current source. When large numbers of digital-to-analog conversion circuits are employed in a system the precision voltage or current source may be shared by the individual digital-to-analog conversion circuits spreading the cost thereof over the number of circuits employed.

Many systems could be built employing digital-to-analog converters but are not because of the cost. It therefore would be advantageous to have a digital-to-analog converter circuit which did not require precision components therein thereby reducing the cost thereof.

BRIEF DESCRIPTION OF THE INVENTION

In accordance with this invention, a plurality of digitally weighted voltages are employed for simultaneously charging a plurality of capacitors, Switches are provided for disconnecting the capacitors from the voltage sources and placing them in series to provide an analog output voltage.

In one embodiment only a select group of the capacitors are charged while a second group is shorted. All of the capacitors are placed in series so that only the capacitors charged contribute to the analog output voltage while the previously shorted capacitors add nothing.

In accordance with a further aspect of this invention, a plurality of digital-to-analog converters are connected in parallel across a single set of digitally weighted voltage sources. A clock signal is provided to drive all of the digital-to-analog converters for connecting and disconnecting the digital-to-analog converters to and from the digitally weighted voltage sources. In this way current is drawn from the digitally weighted voltage sources during a prescribed interval reducing the load regulation requirement on the digitally weighted voltage sources.

DETAILED DESCRIPTION OF THE INVENTION

Figure 1:
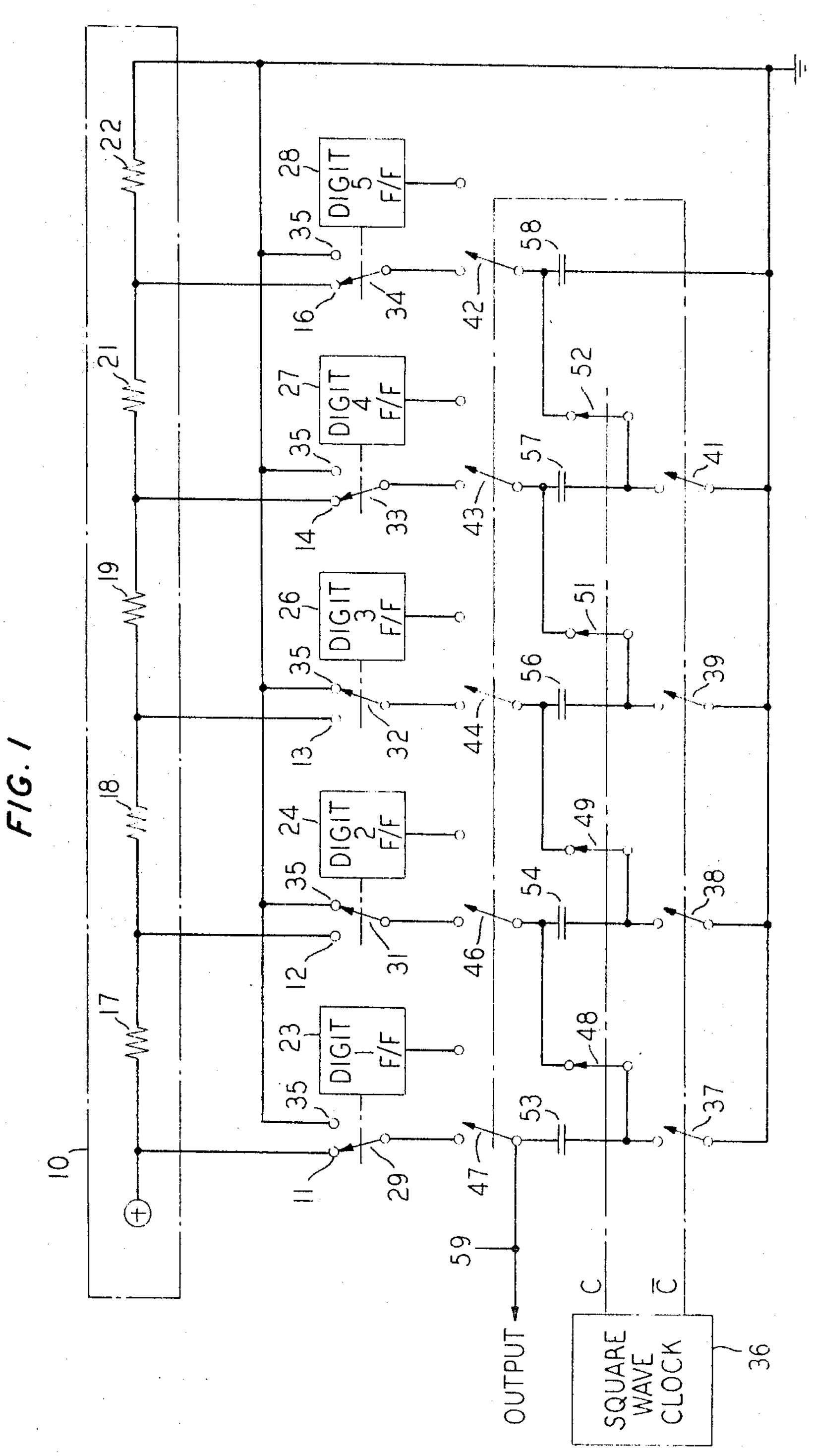
FIG. 1 is a schematic diagram of a first embodiment of digital-to-analog conversion circuit built in accordance with the teachings of this invention.

A digital-to-analog conversion circuit shown in FIG. 1 includes a voltage source 10 providing digitally weighted voltages with respect to ground at taps 11 through 14 and 16 determined by resistors 17 through 19, 21 and 22. A plurality of digit flip-flops 23, 24 26 through 28 operate single pole double throw switches 29 and 31 through 34 respectively to selectively connect each switch to a tap of the power supply 10 or ground available on the terminals designated by the numeral 35.

A square wave clock 36 closes contacts 37 through 39, 41 through 44, 46 and 47 and opens contacts 48, 49, 51 and 52 for a first time interval. The closed contacts connect capacitors 53, 54, and 56 through 58 between switches 29 and 31 through 34 respectively and ground. The open contacts on the other hand isolate the capacitors 53, 54 and 56 through 58 from each other to allow them to each charge independently to the voltage impressed thereacross. The capacitor 58 for example would charge through switch 34 to the voltage appearing on tap 16 while the capacitor 56 would be charged through switch 13 to 0 volts.

During a second time interval, the square wave clock 36 opens the contacts 37 through 39, 41 through 44, 46 and 47 and closes the contacts 48, 49, 51, and 52. The opening of the contacts 37 through 39, 41 through 44, 46 and 47 disconnects the selectively charged capacitors 53, 54, 56 through 58 in series. The voltage across each capacitor 53, 54, and 56 through 58 adds together to provide a composite analog voltage between an output terminal 59 and ground.

The resistors 17 through 19, 21 and 22 may be adjusted to provide digital-to-analog conversions for various code formats. For the common binary digital-to-analog conversion, the resistors 21 and 22 would be of equal value so that the voltage appearing on tap 16 would be one-half the voltage appearing on tap 14. The resistor 19 would have a value equal to the sum of the values of resistors 21 and 22 making the voltage on tap 14 one-half the voltage on tap 13. In a like manner the resistor 18 would have a value equal to the sum of the values of resistors 19, 21 and 22 while the resistor 17 would have a value equal to the sum of the values of resistors 18, 19, 21 and 22. The absolute values of these resistors would be determined by the values of the capacitors 53, 54, 56 through 58 and the time necessary to charge these capacitors from the voltage source 10. It should be apparent that the values of the capacitors 53, 54 and 56 through 58 do not determine in any way the output voltage at terminal 59 so long as sufficient time is allowed to charge them to voltages applied thereacross.

The digit flip-flops 23, 24 and 26 through 28 may be any kind of binary storage device. They may be interconnected to any of the well known ways to serve, for example, as a storage register, a shift register or a counter. The binary information stored in the digit flip-flops would advantageously be changed during the second time interval while the capacitors 53, 54, and 56 through 58 are disconnected from the power source 10. The information stored in digit flip-flops could be changed during the first time interval either sequentially or in parallel. If this were done, however, the time between the changing of the last digit flip-flop and the end of the first time interval must be sufficiently long to allow all the capacitors to be charged to their appropriate values.

Each of the switches 29, 31 through 34 and 37 through 39, 48, 49 51, and 52 may be relay contacts for low speed operation or electronic switching devices for higher speed operation. Field effect transistors for example, may be employed to perform the indicated switching function. The functions illustrated by the single pole double throw switches 29 and 31 through 34 could each be performed by a pair of field effect transistors having their gates driven by complementary signals from the digit flip-flops 23, 24 and 26 through 28.

Figure 2:
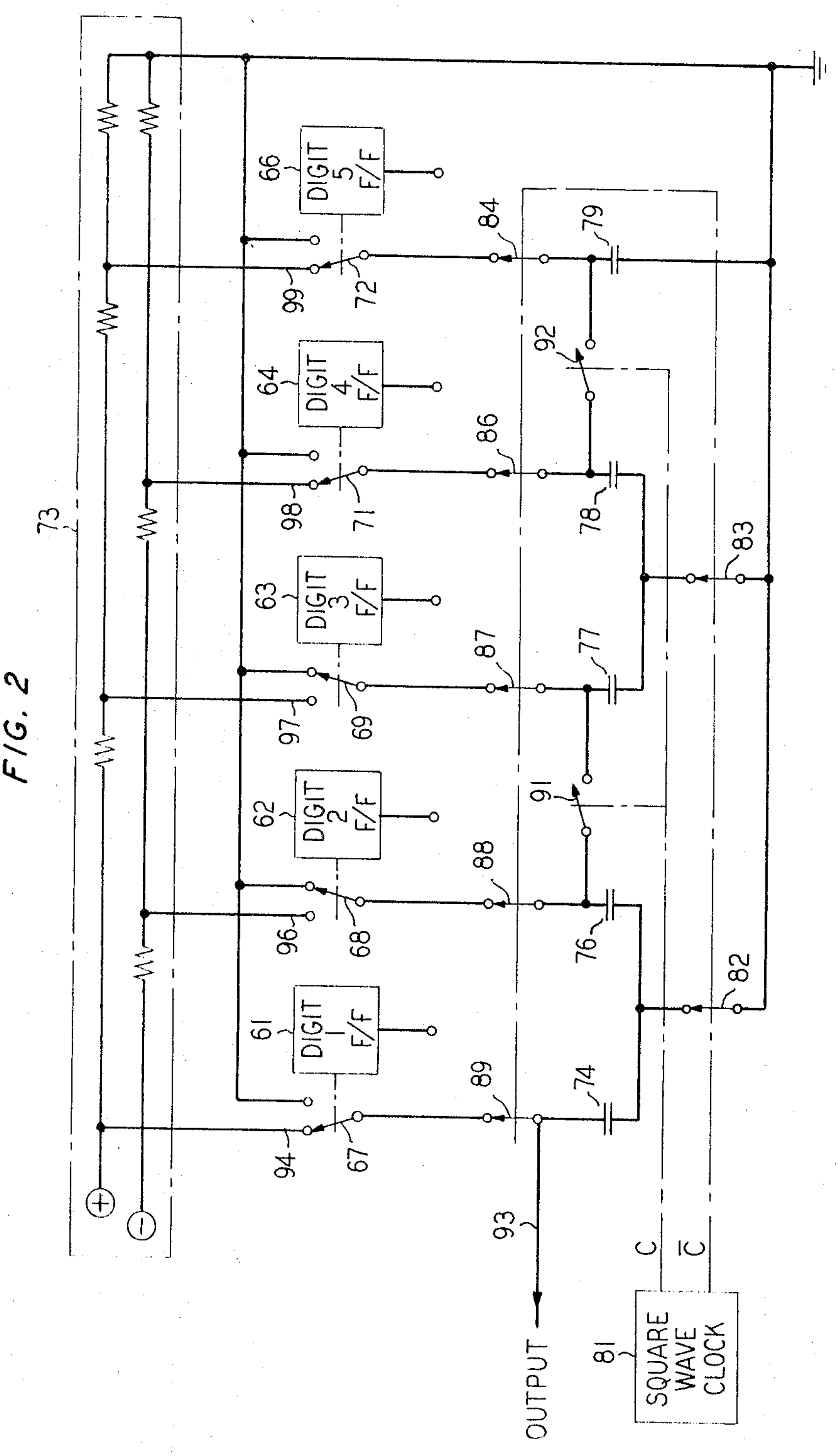
FIG. 2 is a schematic diagram of a second embodiment of digital-to-analog conversion circuit built in accordance with the teachings of this invention.

FIG. 2 shows another digital-to-analog conversion circuit embodying the principles of this invention. As in the circuit of FIG. 1, a plurality of digit flip-flops 61 through 64 and 66 selectively operate a plurality of single pole double throw switches 67 through 69, 71 and 72 respectively to provide digitally weighted charging voltages from a power source 73 to a plurality of capacitors 74 and 76 through 79 respectively.

A square wave clock 81 closes contacts 82 through 84 and 86 through 89 for a first time interval during which the capacitors 74 and 76 through 79 are charged. A pair of contacts 91 and 92 opened during the first time interval are closed by a signal from the square wave clock 81 for a second time interval while the contacts 82 through 84 and 86 through 89 are opened placing the capacitors 74 and 76 through 79 in series providing an analog output signal between an output terminal 93 and ground.

In this embodiment the power supply 73 provides the same voltage values at terminals 94 and 96 through 99 as the power supply 10 in FIG. 1 does at terminals 11–14 and 16 respectively. In the circuit in FIG. 2, however, the voltages at terminals 94, 97 and 99 are positive with respect to ground while the voltages at terminal 96 and 98 are negative with respect to ground. One side of the capacitors 74 and 76 are connected together so that one contact 82 may be employed to connect both capacitors to ground during the first time interval rather than the two contacts 37 and 38 required in the embodiment shown in FIG. 1. Further the switch 48 in FIG. 1 required to connect the capacitors 53 and 54 together is not required in the embodiment of FIG. 2. The positive voltage on the terminal 94 when applied to capacitor 74 charges the capacitor 74 positive with respect to ground. On the other hand when the voltage on terminal 96 is applied to the capacitor 76, the capacitor 76 is charged negatively with respect to ground.

With this arrangement it is seen that during the second time interval when the capacitors are placed in series, the voltages on the capacitors add as a result of the combination of connecting the ground side together during charging and charging one of the pair of capacitors 74 and 76 from a positive voltage and the other from a negative voltage.

Other digital-to-analog conversion circuit configurations can be built in accordance with the teaching of this invention. For example, a plurality of capacitors can all be charged from the taps of a digitally weighted voltage source. A select group of the charged capacitors can then be placed in series in accordance with the states of a plurality of associated digit flip-flops to provide an analog output voltage.

Figure 3:
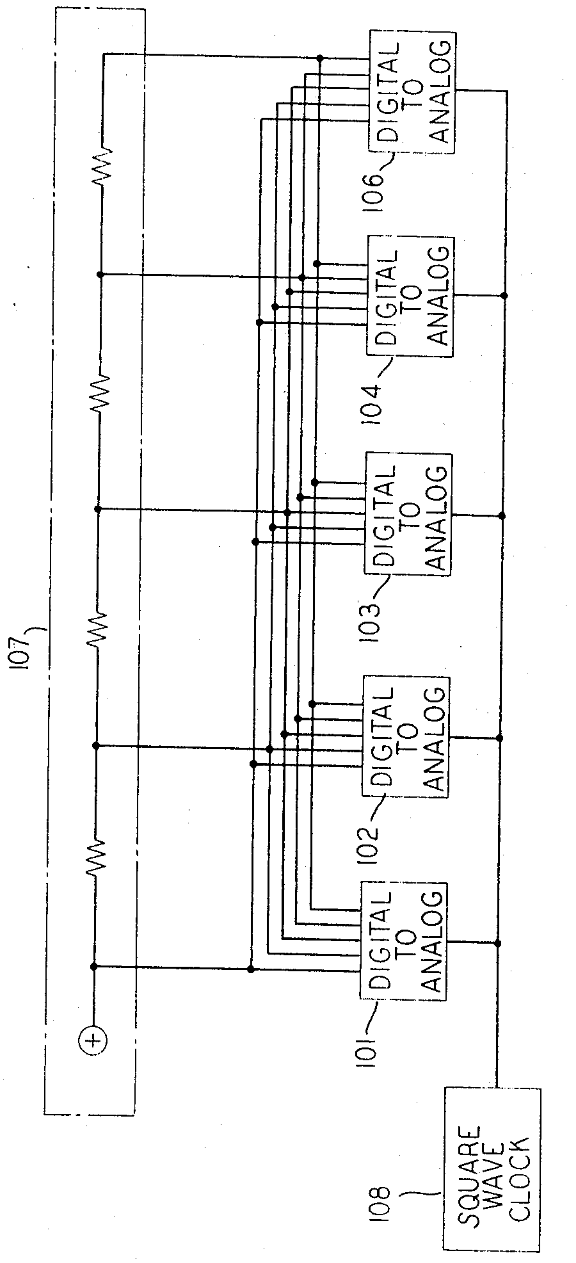
FIG. 3 is a schematic block diagram showing how digital-to-analog converter circuits built in accordance with the teachings of this invention can be operated from a common source of digitally weighted voltages.

A marked cost advantage is obtained by employing digital-to-analog conversion circuits of the type described herein when a large number of such circuits are utilized at a single location so that a common power source may be employed. One difficulty may be encountered, however, in providing precision digital-to-analog conversion when a plurality of digital-to-analog conversion circuits operate off a single power supply. If large currents were being drawn from some or all of the taps of the common power source, the voltage available to other digital-to-analog converters would be affected. Therefore, a system has been devised, see FIG. 3, in which a plurality of digital-to-analog converter circuits 101 through 104 and 106, for example, of the type shown in FIG. 1 are driven from a common digitally weighted power source 107. The timing for each digital-to-analog conversion circuits 101 through 104 and 106 is provided by a common square wave clock 108. In this way no matter what currents are drawn by each of the digital-to-analog converter circuits at the beginning of the first time interval all capacitors are fully charged by the end of the first time interval. Thus no current is being drawn from the power source 107 at the end of the first time interval so that the load regulating does not affect the final accuracy of the digital-to-analog converters 101 through 104 and 106.

Various other embodiments and modifications can be made by those skilled in the art without departing from the spirit and scope of the invention.

I claim:

1. A digital-to-analog converter circuit including: successively-spaced
   - a plurality of voltage sources for providing a plurality of digitally weighted voltages with respect to a point of common voltage;
   - a plurality of terminals;
   - means for applying different ones of said plurality of voltage sources to respective associated ones of said plurality of terminals;
   - a plurality of capacitors, each of said capacitors being associated with one of said terminals;
   - means responsive to a control signal for connecting different ones of said capacitors between respective associated ones of said plurality of terminals and said point of common voltage to charge each of said capacitors to the digitally weighted voltage applied to the respective associated terminal; and
   - means responsive to the absence of said control signal for connecting said capacitors in series with one another to provide an analog output voltage thereacross.

2. The digital-to-analog converter circuit as defined in claim 1 in which said voltage applying means comprises:
   - means connecting only selectable ones of said voltage sources to respective associated ones of said terminals to represent a digitally encoded value; and
   - whereby said output voltage is an analog signal representation of said digitally encoded value.

3. The digital-to-analog conversion circuit as defined in claim 1 in which said voltages are simultaneously applied to said respective capacitors.

4. In combination:
   - a plurality of voltage sources for providing a plurality of digitally weighted voltages with respect to a point of common voltage;
   - a plurality of capacitors;
   - a plurality of bistable circuits each providing a select signal representing a predetermined binary bit of a binary digital value and each of said bistable circuits being associated with one of said capacitors;
   - a plurality of devices, each device providing an associated one of said digitally weighted voltages on a terminal in response to an associated select signal and the same device providing said common voltage on said terminal otherwise;
   - means for connecting different associated ones of said plurality of capacitors between the respective associated ones of said terminals and said point of common voltage during a first time interval, thereby charging each capacitor to the voltage applied between the respective associated terminal and said point of common voltage; and
   - means for connecting said capacitors in series with one another during a second time interval to provide thereacross an analog signal representation of said binary digital value.

5. The combination as defined in claim 4 in which:
   - alternate voltage sources of said plurality of voltage sources provide voltages having an opposite sense with respect to said common voltage; and
   - predetermined pairs of said plurality of capacitors are fixedly connected in series.

6. The combination as defined in claim 4 also including:
   - at least one additional plurality of capacitors;
   - at least one additional plurality of bistable circuits, said additional plurality of bistable circuits providing an additional plurality of select signals, each of said additional plurality of select signals representing a predetermined binary bit of an additional associated binary digital value and each of said additional plurality of bistable circuits being associated with one of said additional plurality of capacitors;
   - at least one additional plurality of devices, each of said additional plurality of devices providing an associated one of said digitally weighted voltages on a terminal in response to an associated select signal provided by one of said additional plurality of bistable circuits and each of said additional plurality of devices providing said common voltage on the last mentioned terminal otherwise;
   - means for connecting different associated ones of said additional plurality of capacitors between the respective terminals of associated ones of said additional plurality of devices and said point of common voltage during said first time interval, thereby charging each of said additional plurality of capacitors to the voltage applied between the respective terminal of the associated device and said point of common voltage; and means for connecting the respective ones of said additional plurality of capacitors in series with one another during said second time interval to provide across said additional plurality of capacitors an analog signal representation of said additional associated binary digital value.

7. The combination as defined in claim 6 in which:

alternate voltage sources of said plurality of voltage sources provide voltages having an opposite sense with respect to said common voltage;

predetermined pairs of a first plurality of capacitors are fixedly connected in series; and predetermined pairs of said second plurality of capacitors are fixedly connected in series.

8. In combination, a digital-to-analog converter comprising:

a plurality of voltage sources for providing digitally weighted voltages with respect to a common voltage point;

a plurality of single pole double throw switching devices, each switching device connecting a different one of said voltage sources to a terminal in response to an associated select signal, and the same device connecting said common voltage point to said terminal otherwise;

a plurality of capacitors, each of said capacitors being associated with a switching device;

a plurality of bistable circuits, each connected to an associated one of said plurality of single pole double throw switching devices for providing during a first time interval an associated select signal representing a predetermined digitally weighted binary bit of a binary digital value;

a plurality of switching devices responsive to a control signal during a first time interval for connecting ones of said capacitors between respective associated ones of said terminals and said common voltage point, thereby applying across each capacitor the voltage applied between the respective associated terminal and said common voltage point; and said devices being responsive to the absence of said control signal during a second time interval for connecting said capacitors in series with one another between a converter output terminal and said common voltage point to provide thereacross an analog voltage proportional to said binary digital value.

9. The combination as defined in claim 8 in which:

said capacitors are connected in series with one another in a predetermined order during said second time interval;

alternate ones of said capacitors with respect to said order are selectively charged during said first time interval to voltages having a first sense with respect to said common voltage;

intervening ones of said capacitors each of which is connected between two of said alternate capacitors are selectively charged during said first time interval to voltages having a second sense with respect to said common voltage; and successive alternate ones of said capacitors with respect to said order are each fixedly connected to a different one of said intervening capacitors to form successive pairs of fixedly connected capacitors with respect to said order.

10. The digital-to-analog converter circuit as defined in claim 2 in which said voltage applying means comprises:

switching means for connecting selected ones of said plurality of voltage sources to respective associated ones of said terminals in response to predetermined binary bits of a binary digital value;

means for connecting to said point of common voltage, the ones of said terminals which are not connected to selected voltage sources; and whereby said analog output signal is an analog signal representation of said binary digital value.